United States Patent
Menon et al.

(10) Patent No.: US 9,568,547 B2
(45) Date of Patent: Feb. 14, 2017

(54) METHOD, APPARATUS AND SYSTEM FOR DYNAMIC BANDWIDTH MANAGEMENT IN SYSTEMS

(71) Applicant: Intel Corporation, Santa Clara, CA (US)

(72) Inventors: Sankaran M. Menon, Austin, TX (US); Babu TRP, Bangalore (IN); Rolf Kuehnis, Vesilahti (FI)

(73) Assignee: Intel Corporation, Santa Clara, CA (US)

( * ) Notice: Subject to any disclaimer, the term of this patent is extended or adjusted under 35 U.S.C. 154(b) by 141 days.

(21) Appl. No.: 14/659,850

(22) Filed: Mar. 17, 2015

(65) Prior Publication Data

US 2016/0274187 A1    Sep. 22, 2016

(51) Int. Cl.
    *G06F 11/36*   (2006.01)
    *G01R 31/317*  (2006.01)
    *G01R 31/3177* (2006.01)
    *G06F 11/34*   (2006.01)

(52) U.S. Cl.
    CPC ..... *G01R 31/31718* (2013.01); *G01R 31/3177* (2013.01); *G06F 11/3466* (2013.01); *G06F 11/3476* (2013.01)

(58) Field of Classification Search
    CPC .. G06F 11/3466; G06F 11/3476; G06F 11/348
    USPC .......................................................... 714/45
    See application file for complete search history.

(56) References Cited

U.S. PATENT DOCUMENTS

| | | | |
|---|---|---|---|
| 9,100,361 B1 * | 8/2015 | Lucchesi | H04L 63/00 |
| 2008/0046674 A1 | 2/2008 | Bernasconi | |
| 2008/0162071 A1 * | 7/2008 | Stevens | G01R 31/31705 702/122 |
| 2010/0257510 A1 * | 10/2010 | Horley | G06F 11/3648 717/128 |
| 2011/0113291 A1 | 5/2011 | Ike | |
| 2011/0320651 A1 | 12/2011 | Poublan et al. | |
| 2012/0266029 A1 * | 10/2012 | Mayer | G06F 11/3476 714/45 |
| 2013/0339789 A1 | 12/2013 | Menon et al. | |

(Continued)

FOREIGN PATENT DOCUMENTS

WO    2006133362    12/2006

OTHER PUBLICATIONS

U.S. Appl. No. 14/484,427, filed Sep. 12, 2014, entitled "Low Power Debug Architecture for System-On-Chips (SoCs) and Systems," by Sankaran Menon, et al.

(Continued)

*Primary Examiner* — Chae Ko
(74) *Attorney, Agent, or Firm* — Trop, Pruner & Hu, P.C.

(57) ABSTRACT

In one embodiment, a bandwidth management controller is coupled to a debug interconnect to dynamically allocate buffer space of a plurality of data buffers to hardware trace information, software trace information, and firmware trace information. The bandwidth management controller further includes a control logic to dynamically control at least one of a voltage and a frequency of the debug interconnect based at least in part on a debug activity level or a functional activity level. Other embodiments are described and claimed.

21 Claims, 9 Drawing Sheets

(56) References Cited

U.S. PATENT DOCUMENTS

2016/0047859 A1* 2/2016 Deutsch .......... G01R 31/31705
714/734

OTHER PUBLICATIONS

U.S. Appl. No. 14/340,802, filed Jul. 25, 2014, entitled "Adaptive and Independent Thermal Control of a Multicore Processor," by James S. Ignowski.
International Searching Authority, "Notification of Transmittal of the International Search Report and the Written Opinion of the International Searching Authority," mailed Jun. 8, 2016 in International application No. PCT/US2016/017308.

* cited by examiner

METHOD, APPARATUS AND SYSTEM FOR DYNAMIC BANDWIDTH MANAGEMENT IN SYSTEMS

TECHNICAL FIELD

Embodiments relate to debug and functional operations for integrated circuits and systems incorporating such circuits.

BACKGROUND

Modern system on chips (SoCs) and other integrated circuits (ICs) are designed with low power directives to achieve longer battery life. Debug of such ICs and SoCs is extremely challenging due to multiple low power domains that are designed in the devices that wake up and sleep with much higher granularity compared to previous generations. Currently available debug solutions provide limited capability to perform debugging of firmware and low power operation.

Another debug concern is that debug bandwidth may be insufficient, especially if debug data from concurrent use cases and features are sent in-band with functional traffic, which can lead to a bottleneck that is typically resolved in favor of the functional traffic. In some cases, it is also possible that debug traffic colliding with functional traffic changes a debug scenario, and as a result debugging becomes difficult.

DETAILED DESCRIPTION

In various embodiments, a power-aware dynamic bandwidth debug architecture is provided for processors and other systems on chip (SoC), including systems in a package (SiP), and multi-chip packages (MCPs), e.g., such that a wide variety of aspects of these devices as implemented in a system can be tested/debugged, such as firmware operations including but not limited to boot up, low power operations including but not limited to low power state entry/exit, among others. This debug architecture may be used for debug of low power tablet and smartphone ICs/SoCs, embedded devices such as Internet of Things (IoTs) devices, wearables and so forth, and low power devices used in client/server applications. Embodiments thus provide hardware/software/firmware observability during all aspects of system operation, including early boot debug, low power conditions and low power entry/exit transitions, to provide effective debug of an entire operation range of the system. In different embodiments, debug triggers may be included in any of firmware, operating system or other software to trigger points at which debug information may be selectively collected, to test a variety of platform operating conditions.

In addition, the debug architecture may be controlled to operate during functional modes as well, to leverage the bandwidth and other resources of this architecture during normal (non-debug) operations of a device. Such use case may occur where increased bandwidth is desired to handle a functional workload, e.g., based at least in part on a functional activity level exceeding a threshold (such as a bandwidth threshold on a primary interconnect of a device).

Still further, as advanced ICs/SoCs have much more stringent power consumption requirements, embodiments provide techniques to selectively enable and disable the debug logic so that the power consumption of such logic can be avoided in the large number of shipped products having such processors. However, understand that embodiments may further provide for a selective enable when one of these products is returned from the field for debug/failure analysis.

In various embodiments, a bandwidth management architecture (BMA) may be provided for a debug unit to debug scenarios where multiple transactions proceed concurrently, and which may be bandwidth intensive and power sensitive. To this end, embodiments may be flexible in resource usage and have a closed loop system that works in conjunction with external tools such as a debug test system (DTS). Embodiments may provide a debug unit having a dedicated debug fabric with configurable width, voltage, frequency, and an ability to control trace buffer size and power utilization of the system.

Figure 1:
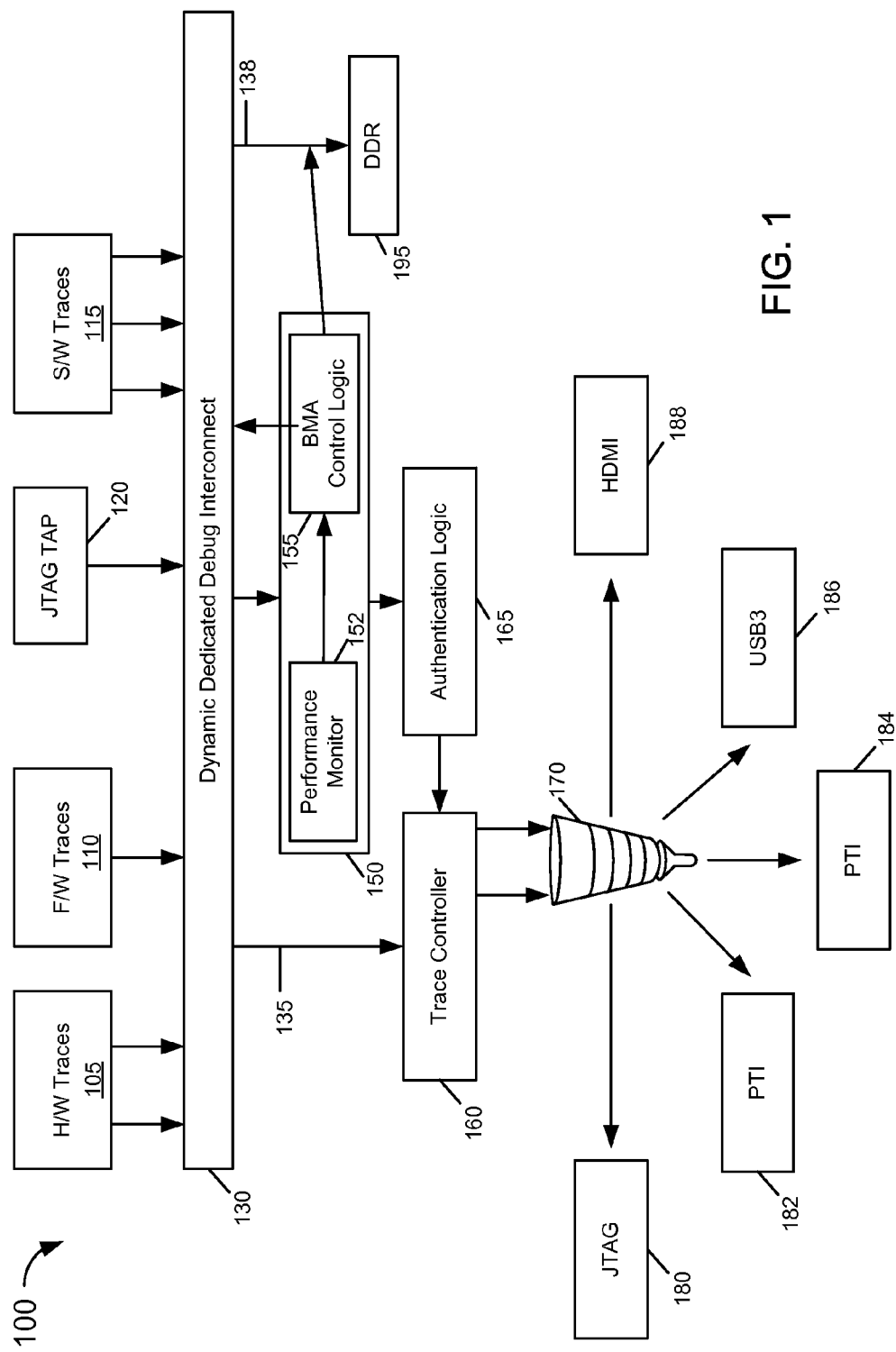
FIG. 1 is a block diagram of a bandwidth management architecture (BMA) in accordance with an embodiment of the present invention.

Referring now to FIG. 1, shown is a block diagram of a bandwidth management architecture (BMA) in accordance with an embodiment of the present invention. As shown in FIG. 1, BMA 100 is a debug system that may be implemented within different types of semiconductor devices such as different types of ICs such as processors, SoC and so forth. In FIG. 1 assume for purposes of discussion that BMA 100 is of a processor such as an SoC in accordance with an embodiment. The portion of the SoC shown primarily relates to design for X (DFx) circuitry, which may be used for various purposes including design for test, design for validation, design for debug and so forth (the X in the DFx can be replaced by "T" to denote Design for Test, "D" to denote Design for Debug, "V" to denote Design for Validation and so forth). This particular design is for the purpose of Design for Debug, as this logic is primarily used for debug purposes.

In general, such circuitry may be used to receive inputs from one or more functional units of the processor or other debug host and appropriately process such information into a desired format for delivery internal or external to the debug host. Such DFx circuitry may be used during the course of processor design, development and debug, and further may be used during incorporation of the processor into a platform such as a portable computing device, e.g., a smartphone, tablet, phablet, or any other portable or other computing device. Of course, the DFx circuitry also may be used for post-platform manufacture test and debug operations.

In the embodiment shown a variety of different sources of debug information coupled to a dynamic dedicated debug interconnect 130. More specifically as shown in FIG. 1, interconnect 130 may receive trace information from a plurality of sources, including hardware traces 105, firmware traces 110, and software traces 115. As an example, this trace information may be received from various functional circuitry including one or more cores of the processor or SoC. In an embodiment, such cores may be a set of heterogeneous or homogeneous cores, e.g., of a given Intel® architecture (IA) design. Of course in other embodiments, cores of other manufacturers such as cores based on an ARM architecture instead may be present. And in other embodiments, combinations of Intel®-based cores and ARM-based cores or other logic may be present. As used herein, "trace" refers to a streaming set of signals or other information obtained from a desired on-chip location, and may generally provide information regarding activity visible in real-time or stored and later retrieved for viewing by a given user, such as an applications developer, applications program, or external equipment to observe system activity. In addition, control information may be received from an external entity, such as a DTS coupled to a device under test via a Joint Test Action Group (JTAG) test access port (TAP) 120. Such control information may be provided to a trace controller 160 via another interconnect 135.

The various trace and other debug information provided to interconnect 130 is then provided to a BMA controller 150, details of which will be described further below. In general, BMA controller 150 includes storage for the trace information, a performance monitor collection unit 152, configured to receive and store performance monitoring information from a variety of sources (e.g., from cores and/or other functional units of a device under test (DUT)), and a BMA control logic 155. Based on analysis of storage levels and performance monitoring information, BMA control logic 155 may dynamically determine allocation of buffer space to the different types of traces, as well as control bandwidth levels on interconnect 130 to enable efficient debug collection and reporting.

In some instances, such as when sufficient resources are unavailable within the bandwidth management architecture, debug information may be provided through functional portions of the device under test via a separate interconnect 138, which may be a functional interconnect over which functional information is typically communicated during normal system operation. Such debug information communicated via interconnect 138 may be stored in a memory 195 that couples to the device (which in an embodiment may be a dynamic random access memory (DRAM) such as a double data rate (DDR) memory).

However as further illustrated in FIG. 1, in normal operating conditions, debug information may be provided through trace controller 160, as authenticated by an authentication logic 165, which may be optionally enabled and/or present in different implementations. In turn, trace controller 160 outputs the debug information through a data funnel 170, which acts as a multiplexer, replicator, or other selection logic to provide data to one or more selected output paths, e.g., under control of trace controller 160. In the illustration shown, example output paths include a JTAG path 180, parallel trace interface (PTI) paths 182 and 184, a universal serial bus (USB) path 186, and a high definition media interface (HDMI) path 188. Although shown with these particular output paths for example purposes, understand that debug data may be provided to a plurality of output sources by any desired connection scheme. In other cases debug data may be output in other formats such as real-time instruction trace (RTIT) signals (and/or real time data trace signals) or a proprietary form of debug signals such as Intel® processor trace (PT) traces, a MIPI Alliance System Trace Protocol (STP), an ARM trace funnel that implements a trace wrapper protocol, an ARM embedded trace macrocell (ETM) or other protocol. In addition, multiple debug sources (such as RTIT, hardware traces, software traces, firmware traces etc.) that funnel into debug interconnect 130 can be controlled independently, which enables selection of one or more parallel multiple debug traces based on debug requirements. In general, such debug data may be provided to a storage location or may be provided to a DTS, which controls the debug architecture and receives and analyzes the debug information using a given debug tool. Understand while shown with this high level in the embodiment of FIG. 1, many variations and alternatives are possible.

Debug interconnect 130 may be dynamically controlled to perform both dynamic voltage and frequency scaling (DVFS) and dynamic bandwidth management system (DBMS) to effectively provide a given debug bandwidth depending on the debug scenario.

With such functional and debug architecture, power efficiency may be achieved, and output bandwidth may be modulated based on a given debug scenario. In addition, control of multiple interconnects may be realized, while applying an enhanced turbo mode for debug and functional operation in which DVFS and DBMS may be performed in tandem, e.g., based on debug bandwidth demands and/or debug requirements, so as to not drop packets. In an embodiment BMA controller 150 may be implemented at least in part via a data management state machine (DMSM) configured to monitor debug traffic and initiate steps to enable DVFS. In some cases, BMA controller 150 may include one or more counters to be used in conjunction with a signal from a DTS to instruct the debug unit to boost (or lower) bandwidth for certain periods of time (e.g., as tracked by the counter).

In an embodiment, DVFS may be performed in multiple steps or levels, in which one or more of voltage and frequency is increased one step at a time until bandwidth close to a desired bandwidth (e.g., target bandwidth) is achieved. Such multi-step operation may proceed until a maximum voltage/frequency setting is reached. Note that in many cases for debug operations, this setting may exceed a normal maximum range for a turbo mode of the device under test (which has a maximum range that may be allowed for functional operation for short periods of time only).

Figure 2:
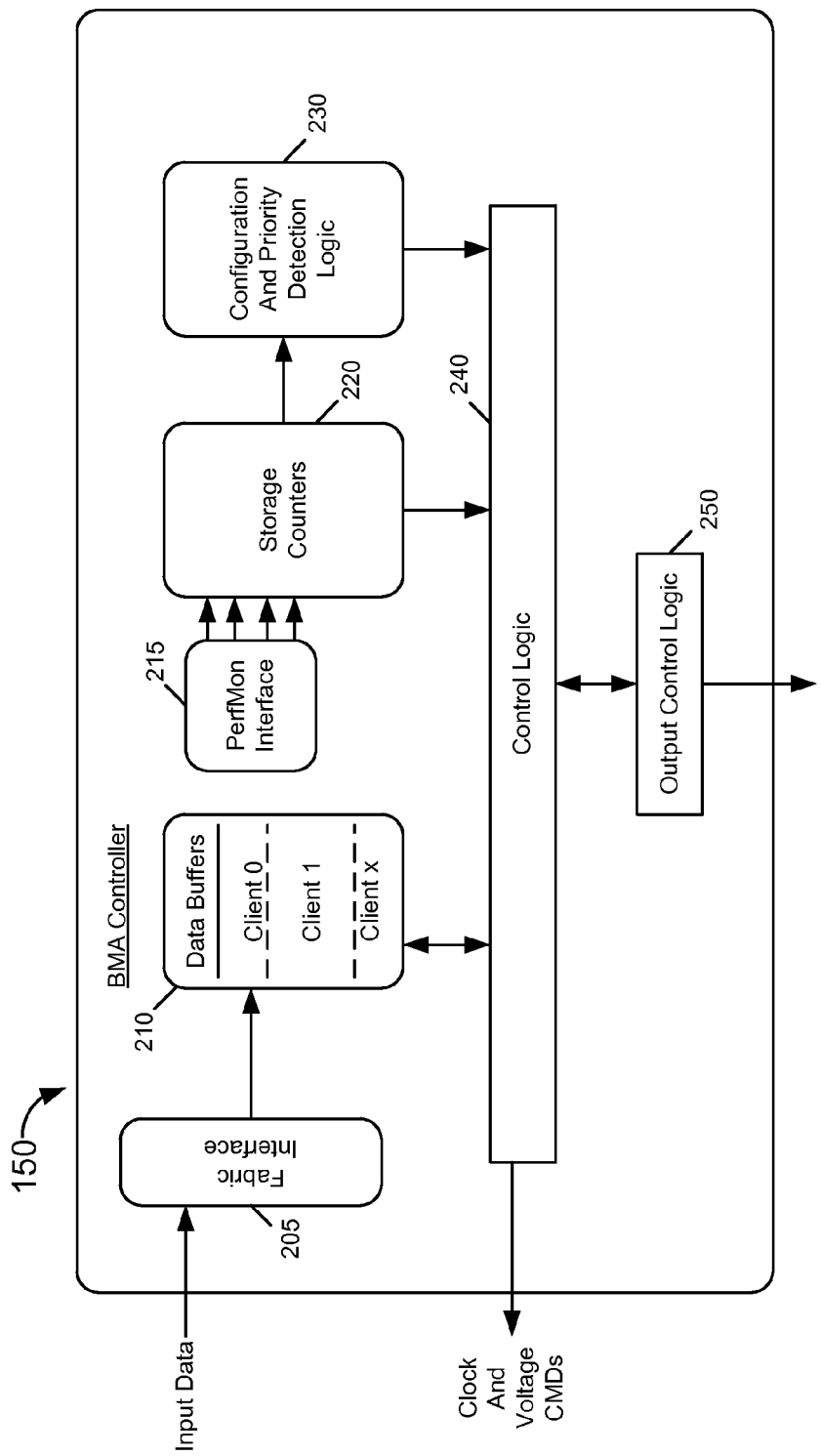
FIG. 2 is a block diagram of further details of a BMA controller in accordance with an embodiment of the present invention.

Next with reference to FIG. 2, shown is a block diagram of further details of a BMA controller in accordance with an embodiment of the present invention. As shown in FIG. 2, BMA controller 150 may correspond to controller 150 of FIG. 1. As seen, input data is coupled through a fabric interface 205 and provided to a plurality of buffers 210, which may be used both for trace and functional information, as described herein. In various embodiments, a large number of buffers may be available to provide a given amount of buffer space. Such buffers may be dynamically allocated to different sources of information as described herein. In one particular embodiment, each functional/trace source (e.g., hardware, software, and firmware) may be provided a fixed allocation of buffer space that is statically provided (and in some cases, each source may be provided with static minimum and maximum buffer allocations).

For example, a DTS may provide control information to set a minimum fixed buffer space on initiation of debug operations to each debug data source. The remaining amount of buffer space in buffer 210 may be dynamically allocated based on usage. Thus during initial debug operations in a development process of a SoC, it is likely that greater amounts of hardware trace information is being received and thus a greater amount of such buffer allocation may be provided for this type of trace information. The allocation of buffer space may further be based on performance monitoring information received from various hardware units of the device under test. As seen, an interface 215 provides a path for communication of incoming performance monitoring information, such as received from performance monitoring units of various cores or other hardware logic of a device under test, which in turn is provided to a performance monitoring storage 220, which may be implemented as a set of performance monitor counters, which may take the form of plural sets of counters each associated with a given functional unit.

Still with reference to FIG. 2, a configuration and priority detection logic 230 may receive such performance monitoring information, as well as control information and provide control for dynamic allocation of buffer space, as well as dynamic control of DVFS operations for the debug architecture. As seen, control information, performance monitoring information, and the trace information itself may be provided to a control logic 240 which may be configured to communicate the trace information and performance monitoring information out of BMA controller 150 via an output control logic 250 (e.g., passing it in turn through a trace controller and out to a selected destination). Still further, control logic 240 may generate control signals for voltage generation and clock generation circuitry to enable DVFS operations. Understand while shown at this high level in the embodiment of FIG. 2, many variations and alternatives are possible.

In an embodiment, a DBMS scheme may be performed to monitor soft thresholds of trace buffers and/or performance monitoring information, and based on the need of debug bandwidth, additional trace buffers may be allocated to one or more masters. The masters are various sources of debug trace or functional traffic. The various masters may include, as representative examples, graphics, CPU, audio, camera, among other sources that can provide functional traffic/debug traces. Performance monitoring information may be used to check usage of trace masters. Logic 240 may thus obtain and monitor control information generated by logic 230 to control an enhanced turbo mode in which both DVFS control and dynamic trace buffer allocation occur concurrently.

Note that in some embodiments, the priority of hardware and software masters can be made configurable for each debug session (and it also can be controlled based on feedback from a DTS). Performance monitor counters maintained in storage 220 may be checked to set a soft allocation of the buffers for each master. If this soft buffer allocation results in starvation of one or more masters based on configured priority, then the soft allocation is increased (e.g., to a configurable limit) for the particular master that is starved the most. If the starvation continues despite increasing the soft allocation, then DVFS (turbo mode) is enabled (e.g., a first level of turbo mode frequency and/or voltage). If further starvation is observed, provision can be made to increase turbo mode (which may be performed to enable DVFS in steps to the highest possible setting for achieving a desired bandwidth).

In certain cases, where there is peak bandwidth configuration for a particular debug session, a backpressure mechanism may be enabled to relieve the bandwidth. Once the peak debug bandwidth requirements are met, then backpressure can be disabled and soft allocation changed as per the debug and bandwidth needs. Note that DVFS and DBMS work in tandem to achieve an enhanced turbo mode to provide efficient bandwidth as well as effective QoS (Quality of Service). In various embodiments, BMA controller 150 may manage debug interconnect 130 (e.g., some or all of frequency, width, voltage) based on the QoS of incoming debug information and DVFS/DBMS effectively to provide lossless system debug traces which enhances debug efficiency.

Note that in addition to increasing bandwidth and frequency via DVFS and DBMS, it is also possible to throttle down (or step-down) allocation for DVFS and allocation of trace buffers for DBMS based on debug/functional requirements, to realize power efficiency. As and when the demand for debug bandwidth increases based on debug scenarios, DVFS/DBMS may be used to incrementally provide the bandwidth. Still further, if additional power savings are desired, mechanisms can be used to throttle functional logic to provide additional power for debug usage, thus achieving power efficiency.

Embodiments may steer the power used by the functional logic by lowering the DVFS/DBMS on the functional logic and increasing steps of DVFS/DBMS of the debug unit to achieve the desired debug bandwidth. By steering power from one or more functional units to the debug unit, a net balance of overall primary power delivery may be realized. That is, via a dedicated debug interconnect, it is possible to steer power used by functional units to supply power to a debug unit so as not to increase overall power delivered by a primary power delivery network.

Also for debug purposes, a device under test can be tested within a limited amount of time such that it does not run for an extended period of time (e.g., days or weeks) or for the intended life of the product. Instead, the voltage and/or frequency may be elevated for a short duration or until the device can be debugged, which can be an hour, a day or even a week. As such, embodiments may enable debug operation at an enhanced turbo mode above and beyond the silicon specification (as a failure of the device itself may be acceptable, particularly in initial design and development debug stages).

In an embodiment, a DTS may provide one or more debug-level instructions. For example, different debug level instructions may be provided to instruct the debug unit to enter a maximum DVFS/DBMS mode, to enter in a full throttle mode, and/or any other desired predetermined state.

Figure 3:
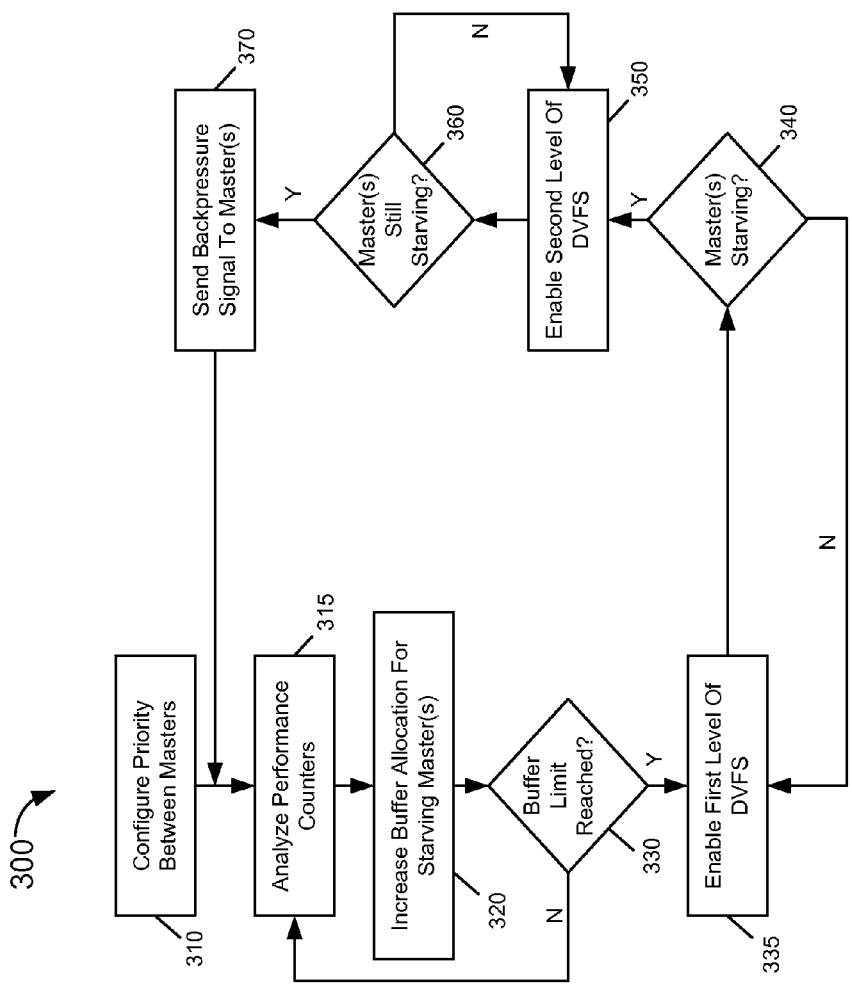
FIG. 3 is a flow diagram of a method for dynamically controlling a debug architecture in accordance with an embodiment of the present invention.

Referring now to FIG. 3, shown is a flow diagram of a method for dynamically controlling a debug architecture in accordance with an embodiment of the present invention. As shown in FIG. 3, method 300 may be performed by appropriate combinations of hardware, software, and/or firmware, including the various control logic of a debug architecture such as discussed above with regard to FIGS. 1 and 2. As seen, method 300 begins by configuring a priority for different sources or masters (block 310). In an embodiment, such priority configuration may be based on receipt of configuration information from a DTS, which indicates a relative priority for a plurality of different sources of debug information. Such priority may take into account the type of debugging being performed. For example, hardware sources may be given higher priority in initial debug of a device under test during initial design and development states, while instead software sources may be given higher priority to perform software bug analysis of a failed device under test received from the field. In an embodiment, priority configuration may include setting an initial allocation of buffer space to a plurality of different sources as well as setting initial levels of voltage and/or frequency of a debug interconnect and hardware.

After such configuration, debug operations may occur. During such debug operations, control passes to block 315 where performance counters may be analyzed. More specifically, such performance counters may indicate performance information from different hardware sources and from this information, a measure of the amount of activity of the different sources can be determined. In addition, performance counters may further include information regarding the buffer usage in the debug architecture to determine the levels of the buffers associated with each of the sources. Control next passes to block 320 where a buffer allocation for a starving master (one or more given sources) can be increased, assuming that sufficient buffer space is available to allocate. If not, based on a combination of the configuration and performance monitoring information a source requiring a lower allocation can have its allocation decreased to thus accommodate a more busy master.

Control next passes to diamond 330 to determine whether a buffer limit is reached. If not, control passes back to block 315 for further operations. Instead if the buffer limit is reached, control passes to block 335 where a first level of DVFS operation may occur. For example, a voltage and frequency of the interconnect and hardware of the debug architecture may be increased to accommodate a higher bandwidth. Note that this combination of increasing buffer allocation and DVFS operates as an enhanced turbo mode in which higher performance debug processing is realized.

Still referring to FIG. 3, next at diamond 340 it can be determined whether one or more masters is still starving for buffer resources. If not, continued operation occurs at the current level of voltage and frequency. Instead if it is determined that such one or more masters are starving of buffer resources, control passes to block 350 where another level of DVFS can be implemented. Note that in different implementations, more than two DVFS levels (above a nominal level) may occur and thus additional iterations or loops of DVFS update and buffer allocation analysis may occur. If even at this higher level of DVFS operation it is determined at diamond 360 that one or more masters is still starving for buffer resources, control passes to block 370 where a backpressure signal may be sent to the master. More specifically, this backpressure signal may be sent to an output buffer that couples between the master and the debug architecture to cause that buffer to operate at a slower rate to enable better handling of the debug information in the debug architecture. Understand while shown at this high level in the embodiment of FIG. 3, many variations and alternatives are possible. For example, while the arrangement shown in FIG. 3 performs dynamic buffer allocation before implementing DVFS measures, such operations may occur in the reverse in another case.

Figure 4:
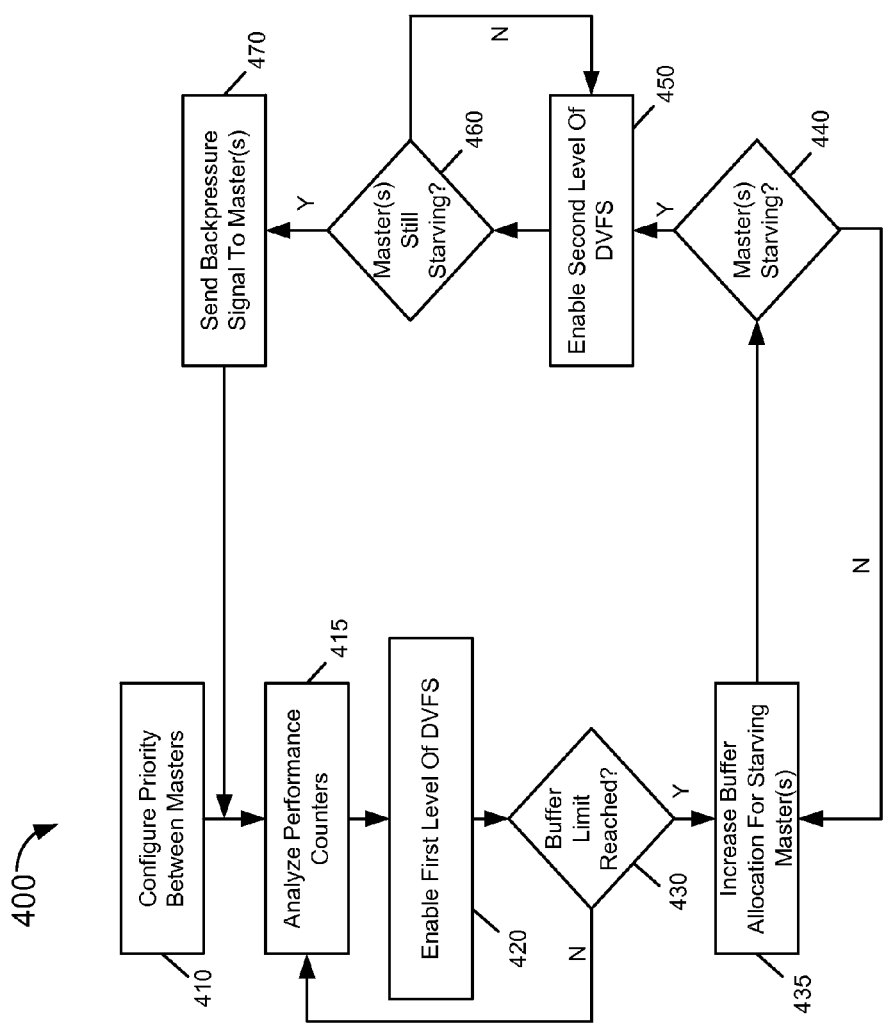
FIG. 4 is a flow diagram of a method for dynamically controlling a debug architecture in accordance with another embodiment of the present invention.

Thus referring now to FIG. 4, shown is a flow diagram of a method for dynamically controlling a debug architecture in accordance with another embodiment of the present invention. In FIG. 4, method 400 similarly may be performed by appropriate combinations of hardware, software, and/or firmware, including the various control logic of a debug architecture such as discussed above with regard to FIGS. 1 and 2. In general method 400 may proceed similarly as method 300. However, in this case the enhanced turbo mode operation may occur in a different manner in which DVFS update to increase voltage and/or frequency occurs before increasing buffer allocations. Thus after configuring priority for different sources (block 410, which may generally proceed as at block 310 discussed above), and initiating debug operation and analyzing performance counters (block 415), control next passes to block 420, where a first level of DVFS operation may occur as described above.

Next, if it is determined at diamond 430 that a buffer limit is reached, control passes to block 435 where buffer allocation for a starving master may be increased. Then at diamond 440 it can be determined whether one or more masters are still starving for buffer resources. If not, continued operation occurs at the current level of voltage and frequency. Instead if it is determined that such one or more masters are starving of buffer resources, control passes to block 450 where another level of DVFS can be implemented, as described above. If even at this higher level of DVFS operation it is determined at diamond 460 that one or more masters is still starving for buffer resources, control passes to block 470 where a backpressure signal may be sent to the master, as described above. Understand that still further examples of dynamic bandwidth and DVFS control may occur to enable an enhanced turbo mode for a debug architecture as described herein.

Figure 5:
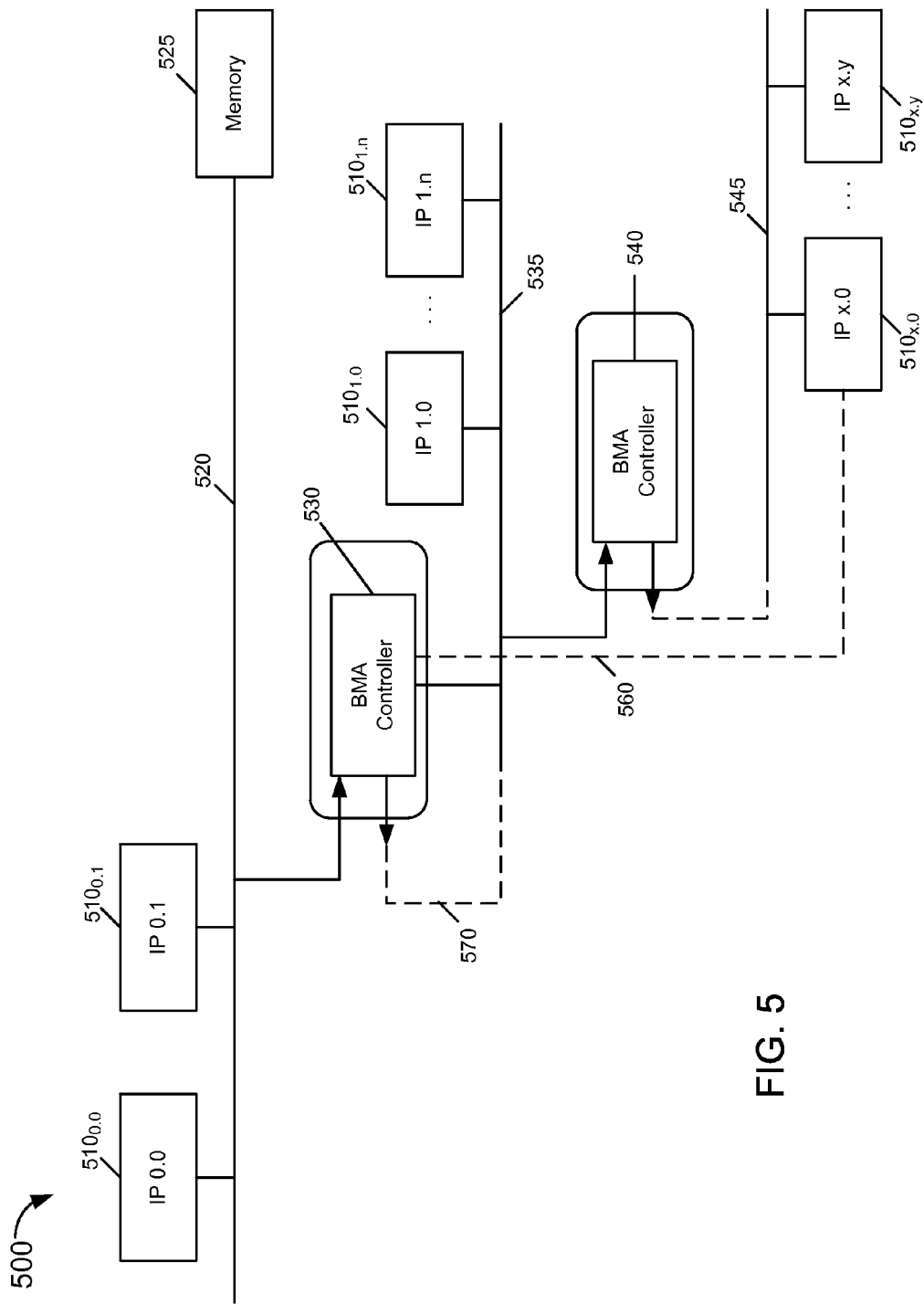
FIG. 5 is a block diagram of a portion of an SoC in accordance with an embodiment of the present invention.

Referring now to FIG. 5, shown is a block diagram of a portion of an SoC in accordance with an embodiment of the present invention. As shown in FIG. 5, SoC 500 includes a plurality of functional units $510_{0.0}$-$510_{x,y}$. In different implementations, each IP logic unit may correspond to a core or other type of functional unit. For example, in some cases a plurality of heterogeneous or homogeneous cores may be present, along with dedicated processing units, such as one or more graphics processing units or other specialized processing units.

As seen, IP logic units $510_{0.0}$ and $510_{0.1}$ are coupled to a first interconnect 520 that in turn is coupled to a memory 525, which can be implemented as a separate die within a single SoC package (or which may be an off-chip memory). As further illustrated, interconnect 520 may couple to a first BMA controller 530, which may control bandwidth and voltage/frequency dynamically, as described herein. Depending on bandwidth requirements, automatic re-routing of bandwidth and/or functional traffic may occur via one or more auxiliary interconnects 560 and 570.

As further illustrated, additional levels of interconnects and IP logics are present, along with another BMA controller. More specifically, IP logic units $510_{1.0}$-$510_{1.n}$ couple to BMA controller 530 via an interconnect 535 and further to a BMA controller 540 that in turn may couple to yet another interconnect 545 that couples to IP logic units $510_{x.0}$-$510_{x,y}$. Understand while shown at this high level in FIG. 5, many variations and alternative implementations are possible.

As shown in FIG. 5, BMA controller 530 (or other present BMA controllers) may buffer data locally to cope with fabric bandwidth saturation or route data via an alternate path (shown by dashed lines). If such techniques are still insufficient, BMA controller 530 may generate one or more backpressure signals or drop the data (depending on QoS). If the data packets are for debug purposes and the platform is in R&D use, enhanced turbo mode may be performed, as potential impact on device lifetime can be ignored.

Embodiments thus may automatically and dynamically re-route debug/functional traffic based on bandwidth availability. For example, if the device under test is in a particular activity state (e.g., S0) and if there is sufficient bandwidth to route debug traffic via available functional paths, it will do so. If performance monitoring counters indicate that headroom is low, a secondary path such as a debug path (for example additional VISA lanes) may be enabled to ensure minimal intrusiveness on the functional traffic. Another example is if a device under test is in another activity state (e.g., S0i3) and if the functional fabric is powered down, debug traffic can be re-routed and sent over a debug path or VISA lanes to be directed to the PTI ports, as another example. In still other cases, during functional (non-debug) operation, the debug interconnect(s) may be used to communicate to functional traffic, e.g., under control of control logic of one or more of IP logic units.

In various embodiments, debug capabilities of a SoC can be enhanced by adding more stability and enhanced bandwidth support to enable internal and external customers to debug failures using hardware, software and firmware tracing capability more efficiently.

Using an embodiment, QoS measures are provided, along with combinations of DVFS and dynamic buffering (to provide an enhanced turbo mode which may exceed device specifications for short time physical limits). Still further embodiments re-route traffic where possible (e.g., some data might use a shared fabric and depending power states could travel on dedicated lines). Embodiments presented here can also enable use of the debug architecture for functional traffic in addition to debug traffic.

Figure 6:
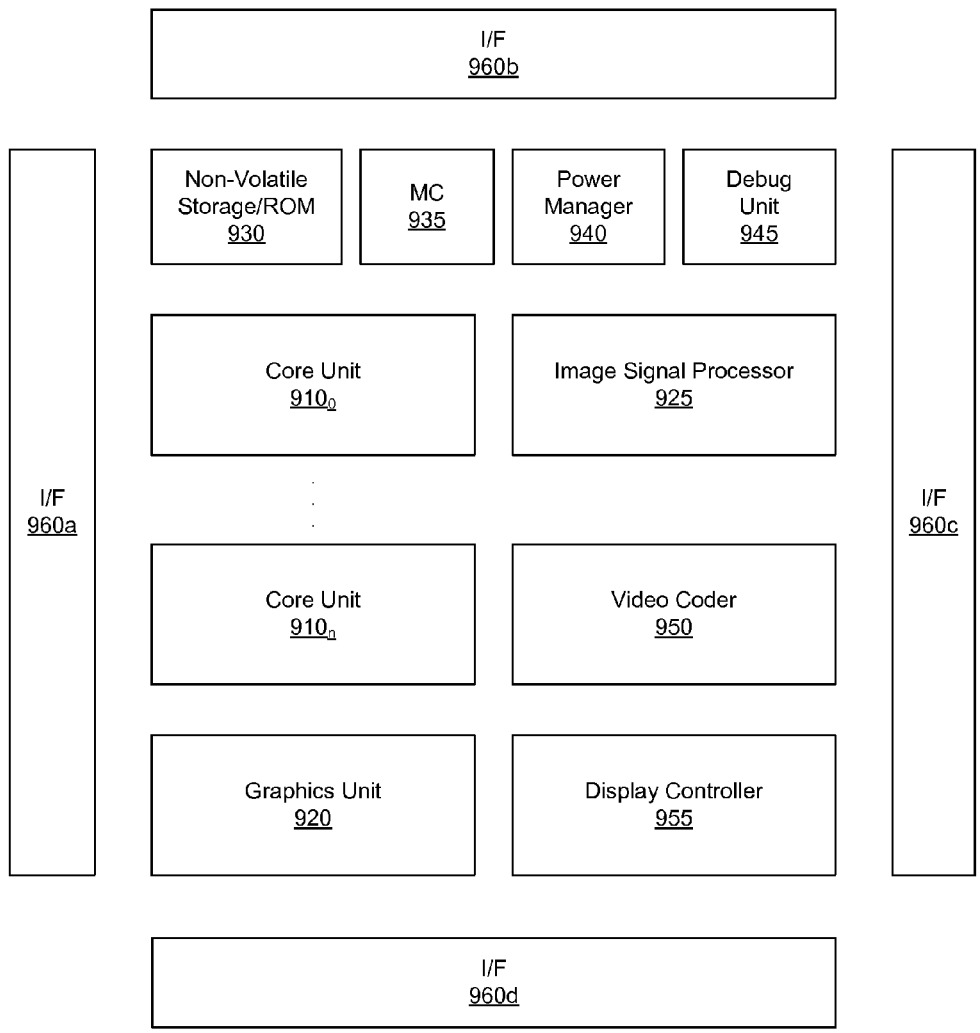
FIG. 6 is a block diagram of a system in accordance with an embodiment of the present invention.

Referring now to FIG. 6, shown is a block diagram of a system in accordance with an embodiment of the present invention. In the embodiment of FIG. 6, system 900 may be a SoC including multiple domains, each of which may be controlled to operate at an independent operating voltage and operating frequency. As a specific illustrative example, system 900 may be an Intel® Architecture Core™-based SoC such as an i3, i5, i7 or another such processor available from Intel Corporation. However, other low power SoCs or processors such as available from Advanced Micro Devices, Inc. (AMD) of Sunnyvale, Calif., an ARM-based design from ARM Holdings, Ltd. or licensee thereof or a MIPS-based design from MIPS Technologies, Inc. of Sunnyvale, Calif., or their licensees or adopters may instead be present in other embodiments such as an Apple A7 processor, a Qualcomm Snapdragon processor, or Texas Instruments OMAP processor. Such SoC may be used in a low power system such as a smartphone, tablet computer, phablet computer, Ultrabook™ computer, IoT device, wearable, or other portable computing device.

In the high level view shown in FIG. 6, SoC 900 includes a plurality of core units $910_0$-$910_n$. Each core unit may include one or more processor cores, one or more cache memories and other circuitry. Each core unit 910 may support one or more instructions sets (e.g., an x86 instruction set (with some extensions that have been added with newer versions); a MIPS instruction set; an ARM instruction set (with optional additional extensions such as NEON)) or other instruction set or combinations thereof. Note that some of the core units may be heterogeneous resources (e.g., of a different design). In addition, each such core may be coupled to a cache memory (not shown) which in an embodiment may be a shared level two (L2) cache memory. A non-volatile storage 930 may be used to store various program and other data. For example, this storage may be used to store at least portions of microcode, boot information such as a BIOS, other system software or so forth.

Each core unit 910 may also include an interface such as a bus interface unit to enable interconnection to additional circuitry of the SoC. In an embodiment, each core unit 910 couples to a coherent fabric that may act as a primary cache coherent on-die interconnect that in turn couples to a memory controller 935. In turn, memory controller 935 controls communications with a memory such as a DRAM (not shown for ease of illustration in FIG. 6).

In addition to core units, additional processing engines are present within the processor, including at least one graphics unit 920 which may include one or more graphics processing units (GPUs) to perform graphics processing as well as to possibly execute general purpose operations on the graphics processor (so-called GPGPU operation). In addition, at least one image signal processor 925 may be present. Signal processor 925 may be configured to process incoming image data received from one or more capture devices, either internal to the SoC or off-chip.

Other accelerators also may be present. In the illustration of FIG. 6, a video coder 950 may perform coding operations including encoding and decoding for video information, e.g., providing hardware acceleration support for high definition video content. A display controller 955 further may be provided to accelerate display operations including providing support for internal and external displays of a system. In addition, a debug unit 945 may be present and which may include a dedicated dynamic bandwidth debug architecture as described herein. Each of the units may have its power consumption controlled via a power manager 940, which may include control logic to perform various power management techniques, including the dynamic DVFS and dynamic bandwidth management to enable enhanced turbo mode during operation, as described herein. Understand that as described herein, resources of debug unit 945 also may be used in functional mode, e.g., based on workload demands.

In some embodiments, SoC 900 may further include a non-coherent fabric coupled to the coherent fabric to which various peripheral devices may couple. One or more interfaces 960a-960d enable communication with one or more off-chip devices. Such communications may be according to a variety of communication protocols such as PCIe™, GPIO, USB, I²C, UART, MIPI, SDIO, DDR, SPI, HDMI, among other types of communication protocols. Although shown at this high level in the embodiment of FIG. 6, understand the scope of the present invention is not limited in this regard.

Figure 7:
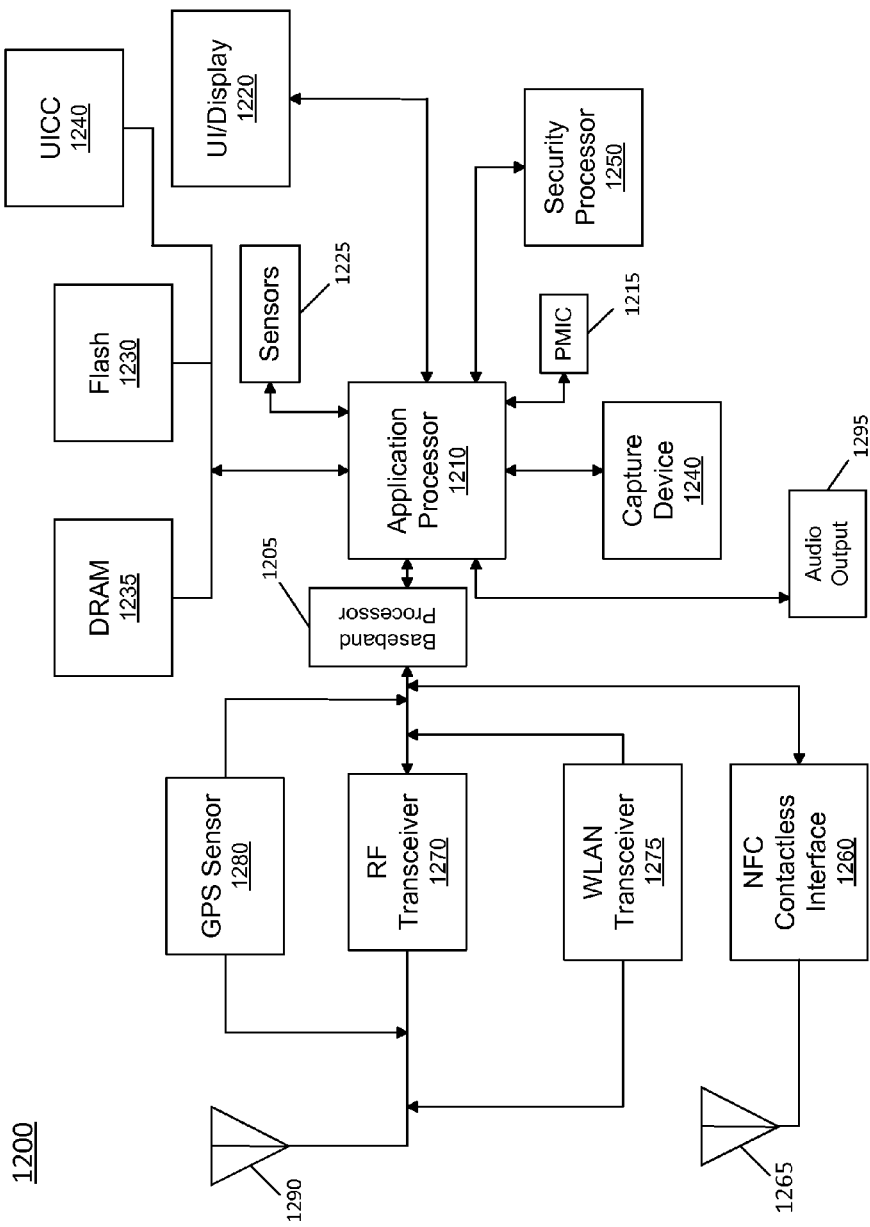
FIG. 7 is a block diagram of an example system with which embodiments can be used.

Referring now to FIG. 7, shown is a block diagram of an example system with which embodiments can be used. As seen, system 1200 may be a smartphone or other wireless communicator. A baseband processor 1205 is configured to perform various signal processing with regard to communication signals to be transmitted from or received by the system. In turn, baseband processor 1205 is coupled to an application processor 1210, which may be a main SoC of the system to execute an OS and other system software, in addition to user applications such as many well-known social media and multimedia apps. Application processor 1210 may further be configured to perform a variety of other computing operations for the device, and may include a dedicated dynamic bandwidth debug architecture as described herein.

In turn, application processor 1210 can couple to a user interface/display 1220, e.g., a touch screen display. In addition, application processor 1210 may couple to a memory system including a non-volatile memory, namely a flash memory 1230 and a system memory, namely a dynamic random access memory (DRAM) 1235. As further seen, application processor 1210 further couples to a capture device 1240 such as one or more image capture devices that can record video and/or still images.

Still referring to FIG. 7, a universal integrated circuit card (UICC) 1240 comprising a subscriber identity module and possibly a secure storage and cryptoprocessor is also coupled to application processor 1210. System 1200 may further include a security processor 1250 that may couple to application processor 1210. A plurality of sensors 1225 may couple to application processor 1210 to enable input of a variety of sensed information such as accelerometer and other environmental information. An audio output device 1295 may provide an interface to output sound, e.g., in the form of voice communications, played or streaming audio data and so forth.

As further illustrated, a near field communication (NFC) contactless interface 1260 is provided that communicates in a NFC near field via an NFC antenna 1265. While separate antennae are shown in FIG. 7, understand that in some implementations one antenna or a different set of antennae may be provided to enable various wireless functionality.

A power management integrated circuit (PMIC) 1215 couples to application processor 1210 to perform platform level power management. To this end, PMIC 1215 may issue power management requests to application processor 1210 to enter certain low power states as desired. Furthermore, based on platform constraints, PMIC 1215 may also control the power level of other components of system 1200.

To enable communications to be transmitted and received, various circuitry may be coupled between baseband processor 1205 and an antenna 1290. Specifically, a radio frequency (RF) transceiver 1270 and a wireless local area network (WLAN) transceiver 1275 may be present. In general, RF transceiver 1270 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. In addition a GPS sensor 1280 may be present. Other wireless communications such as receipt or transmission of radio signals, e.g., AM/FM and other signals may also be provided. In addition, via WLAN transceiver 1275, local wireless communications, such as according to a Bluetooth™ standard or an IEEE 802.11 standard such as IEEE 802.11a/b/g/n can also be realized.

Figure 8:
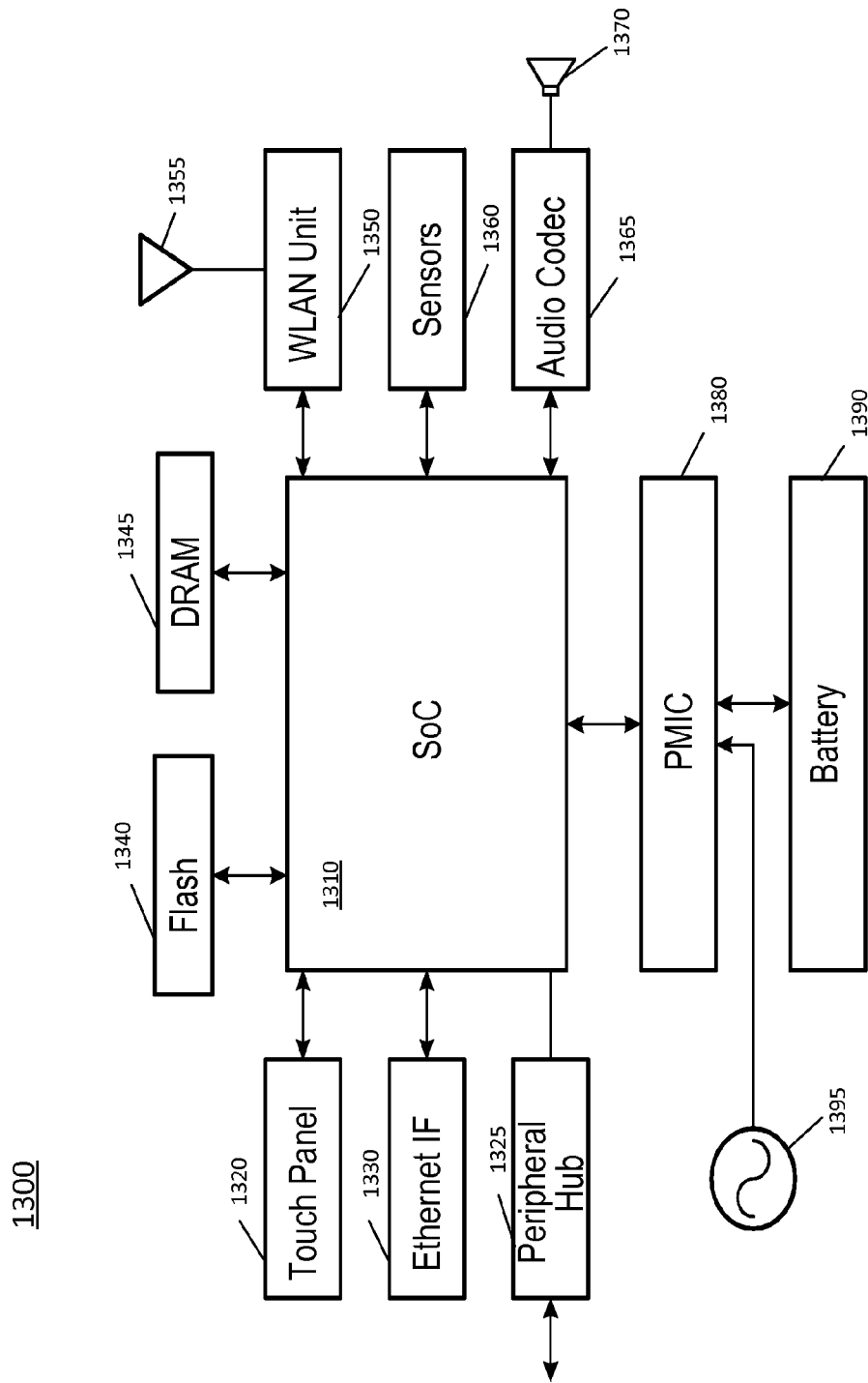
FIG. 8 is a block diagram of another example system with which embodiments may be used.

Referring now to FIG. 8, shown is a block diagram of another example system with which embodiments may be used. In the illustration of FIG. 8, system 1300 may be a mobile low-power system such as a tablet computer, 2:1 tablet, phablet or other convertible or standalone tablet system. As illustrated, a SoC 1310 is present and may be configured to operate as an application processor for the device. SoC 1310 may include a dedicated dynamic bandwidth debug architecture as described herein.

A variety of devices may couple to SoC 1310. In the illustration shown, a memory subsystem includes a flash memory 1340 and a DRAM 1345 coupled to SoC 1310. In addition, a touch panel 1320 is coupled to the SoC 1310 to provide display capability and user input via touch, including provision of a virtual keyboard on a display of touch panel 1320. To provide wired network connectivity, SoC 1310 couples to an Ethernet interface 1330. A peripheral hub 1325 is coupled to SoC 1310 to enable interfacing with various peripheral devices, such as may be coupled to system 1300 by any of various ports or other connectors.

In addition to internal power management circuitry and functionality within SoC 1310, a PMIC 1380 is coupled to SoC 1310 to provide platform-based power management, e.g., based on whether the system is powered by a battery 1390 or AC power via an AC adapter 1395. In addition to this power source-based power management, PMIC 1380 may further perform platform power management activities based on environmental and usage conditions. Still further, PMIC 1380 may communicate control and status information to SoC 1310 to cause various power management actions within SoC 1310.

Still referring to FIG. 8, to provide for wireless capabilities, a WLAN unit 1350 is coupled to SoC 1310 and in turn to an antenna 1355. In various implementations, WLAN unit 1350 may provide for communication according to one or more wireless protocols, including an IEEE 802.11 protocol, a Bluetooth™ protocol or any other wireless protocol.

As further illustrated, a plurality of sensors 1360 may couple to SoC 1310. These sensors may include various accelerometer, environmental and other sensors, including user gesture sensors. Finally, an audio codec 1365 is coupled to SoC 1310 to provide an interface to an audio output device 1370. Of course understand that while shown with this particular implementation in FIG. 8, many variations and alternatives are possible.

Figure 9:
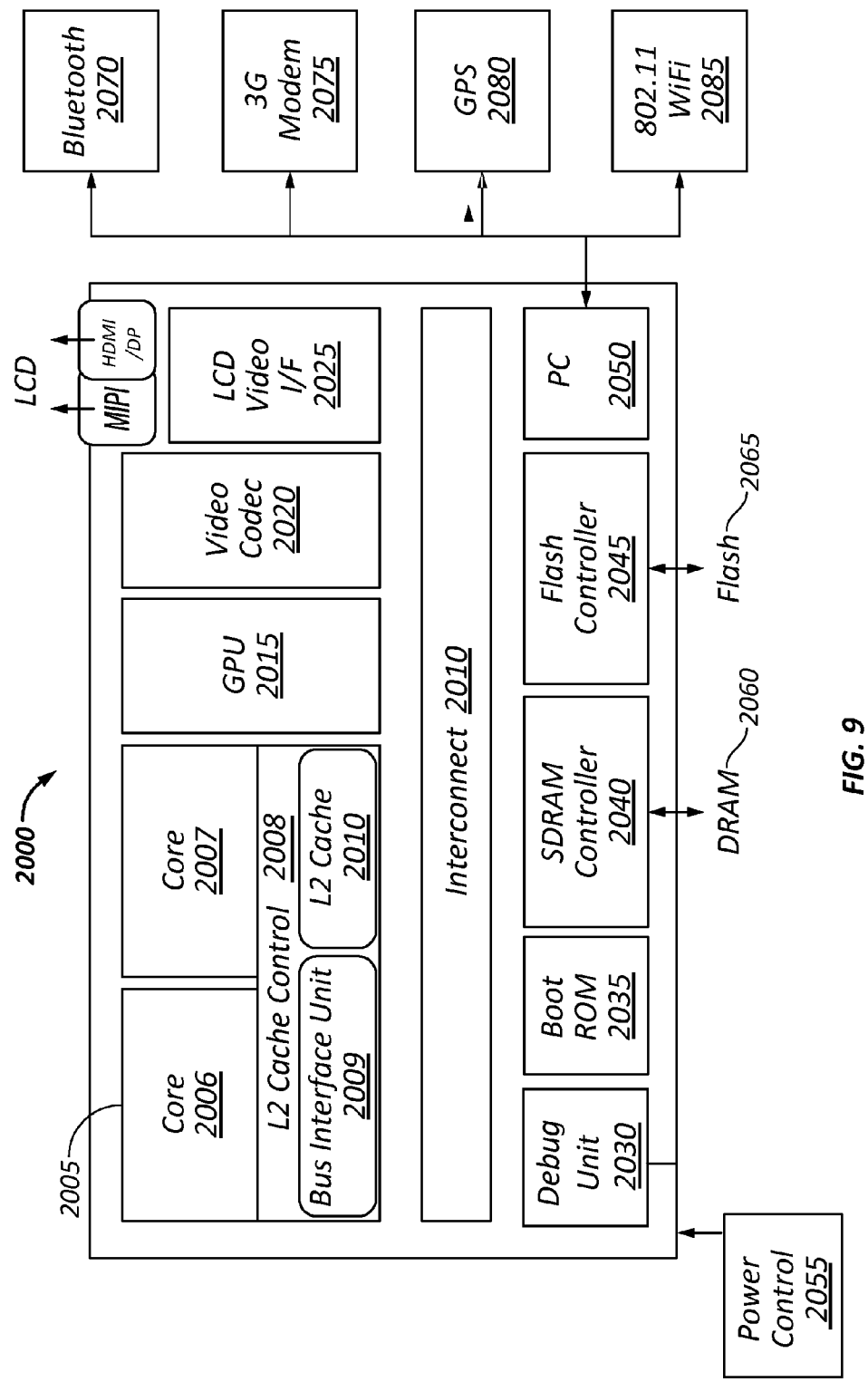
FIG. 9 is a block diagram of a system on a chip in accordance with an embodiment.

Turning next to FIG. 9, an embodiment of a SoC design in accordance with an embodiment is depicted. As a specific illustrative example, SoC 2000 is included in user equipment (UE). In one embodiment, UE refers to any device to be used by an end user, such as a wearable, hand-held phone, smartphone, tablet, ultra-thin notebook, notebook, IoT device, or any other similar device. Often a UE connects to a base station or node.

Here, SoC 2000 includes 2 cores-2006 and 2007. Similar to the discussion above, cores 2006 and 2007 may conform to an Instruction Set Architecture, such as an Intel® Architecture Core™-based processor, an Advanced Micro Devices, Inc. (AMD) processor, a MIPS-based processor, an ARM-based processor design, or a customer thereof, as well as their licensees or adopters. Cores 2006 and 2007 are coupled to cache control 2008 that is associated with bus interface unit 2009 and L2 cache 2010 to communicate with other parts of system 2000. Interconnect 2010 includes an on-chip interconnect.

Interconnect 2010 provides communication channels to the other components, such as a debug unit 2030, which may have a dedicated dynamic bandwidth architecture as described herein for use both in debug mode and functional mode. As seen debug unit 2030 may interface with a plurality of off-chip connections. Interconnect 2010 also couples to a boot ROM 2035 to hold boot code for execution by cores 2006 and 2007 to initialize and boot SOC 2000, a SDRAM controller 2040 to interface with external memory (e.g. DRAM 2060), a flash controller 2045 to interface with non-volatile memory (e.g. Flash 2065), a peripheral controller 2050 (e.g. Serial Peripheral Interface) to interface with peripherals, video codecs 2020 and Video interface 2025 to display and receive input (e.g. touch enabled input) via one of MIPI or HDMI/DP interface, GPU 2015 to perform graphics related computations, etc.

In addition, the system illustrates peripherals for communication, such as a Bluetooth module 2070, 3G modem 2075, GPS 2080, and WiFi 2085. Also included in the system is a power controller 2055.

The following examples pertain to further embodiments.

In one example, an apparatus comprises: a plurality of IP logic units, each to execute instructions; a debug interconnect coupled to the plurality of IP logic units, the debug interconnect separate from a second interconnect that couples the plurality of IP logic units; a plurality of data buffers coupled to the debug interconnect, the plurality of data buffers to store hardware trace information, software trace information, and firmware trace information; and a bandwidth management controller coupled to the debug interconnect, the bandwidth management controller to dynamically allocate buffer space of the plurality of data buffers to the hardware trace information, the software trace information, and the firmware trace information, the bandwidth management controller further including a control logic to dynamically control at least one of a voltage and a frequency of the debug interconnect based at least in part on a debug activity level.

In an example, a trace controller is to receive trace information from the plurality of data buffers and to provide the trace information to one of a plurality of output paths.

In an example, the debug interconnect is to communicate functional information between at least some of the plurality of IP logic units during functional operation of the apparatus.

In an example, a first IP logic unit includes a control logic to enable the debug interconnect and the plurality of data buffers during the functional operation based on a functional activity level.

In an example, the apparatus of one or more of the above examples further comprises a performance monitoring unit to receive performance monitoring information from at least some of the plurality of IP logic units during debug operation.

In an example, the control logic of the bandwidth management controller is to dynamically control the at least one of the voltage and the frequency further based on the performance monitoring information.

In an example, the control logic of the bandwidth management controller is to dynamically control the at least one of the voltage and the frequency responsive to a debug-level instruction received from a debug test system coupled to the apparatus.

In an example, the bandwidth management controller of one or more of the above examples is to send a backpressure signal to a first input buffer associated with a first IP logic unit to reduce a bandwidth of incoming trace information from the first IP logic unit.

In an example, the bandwidth management controller of one or more of the above examples is to disable the debug interconnect during functional operation of the apparatus.

In an example, the bandwidth management controller of one or more of the above examples is to send a power reduction signal to a power management unit of the apparatus to enable the power management unit to reduce an activity level of one or more of the plurality of IP logic units during debug operation, where the bandwidth management controller is to dynamically control the debug interconnect to operate at a turbo mode level based at least in part on the reduced activity level.

In another example, a method comprises: determining an amount of hardware trace information, software trace information, and firmware trace information being received in a debug unit of the integrated circuit, based at least in part on performance monitoring information received from a plurality of logic units of the integrated circuit; based at least in part on determining the amount, dynamically allocating additional buffer space to a selected one of the hardware trace information, the software trace information, and the firmware trace information; determining a buffer level of buffer space of the debug unit allocated to the selected one trace information; and if the buffer level exceeds a first threshold, dynamically increasing at least one of a voltage and a frequency of a dedicated debug interconnect coupled between the plurality of logic units and the buffer space based thereon.

In an example, the method further comprises communicating at least some of the selected one trace information from the buffer space to a debug test system coupled to the integrated circuit.

In an example, the method further comprises dynamically increasing the at least one of the voltage and the frequency responsive to a debug-level instruction received from a debug test system coupled to the integrated circuit.

In an example, the method further comprises sending a backpressure signal to a first input buffer associated with a first logic unit to reduce a bandwidth of incoming trace information from the first logic unit.

In an example, the method further comprises enabling the integrated circuit to operate at one or more of a voltage and a frequency higher than a device specification during debug operation, under control of a debug test system coupled to the integrated circuit.

In another example, a computer readable medium including instructions is to perform the method of any of the above examples.

In another example, a computer readable medium including data is to be used by at least one machine to fabricate at least one integrated circuit to perform the method of any one of the above examples.

In another example, an apparatus comprises means for performing the method of any one of the above examples.

In a still further example, a system comprises: at least one core to independently execute instructions; at least one IP logic to independently perform operations; a first interconnect coupled to the at least one core and the at least one IP logic; and a debug unit coupled to the at least one core and the at least one IP logic.

In an example, the debug unit includes: a dedicated debug interconnect; a plurality of buffers to store hardware trace information, software trace information, and firmware trace information in a debug mode and to store functional information in a functional mode; and a control logic to dynamically allocate the plurality of buffers to the hardware trace information, the software trace information, and the firmware trace information in the debug mode based at least in part on performance monitoring information received from the at least one core and the at least one IP logic, where the control logic is to dynamically control a frequency and a voltage of the debug unit in the debug mode based at least in part on a buffer level consumed by at least one of the hardware trace information, the software trace information, and the firmware trace information.

In an example, the control logic is to dynamically increase allocation of the plurality of buffers for the hardware trace information responsive to a starvation signal received from a master of the hardware trace information.

In an example, the control logic is to limit the dynamic increase to a configured maximum level, the configured maximum level received from a debug test system coupled to the system.

In an example, the system comprises a SoC.

In an example, the control logic is to enable the functional information to be communicated via the dedicated debug interconnect in the functional mode of the SoC.

In an example, the control logic is to enable the dedicated debug interconnect to operate at one or more of a voltage and a frequency higher than a device specification during the debug mode, under control of a debug test system coupled to the system.

In an example, the system of one or more of the above examples further comprises a performance monitoring unit to receive performance monitoring information from the at least one core and the at least one IP logic during the debug mode, where the control logic is to dynamically control the at least one of the voltage and the frequency of the debug unit based at least in part on the performance monitoring information, and thereafter if the at least one core is starved, send a backpressure signal to a first input buffer associated with the at least one core to reduce a bandwidth of incoming trace information therefrom.

Note that the above SoC can be implemented using various means.

In an example, the SoC is a processor incorporated in a user equipment touch-enabled device.

In another example, a system comprises a display and a memory, and includes the SoC of one or more of the above examples.

Understand that various combinations of the above examples are possible.

Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

Embodiments may be implemented in code and may be stored on a non-transitory storage medium having stored thereon instructions which can be used to program a system to perform the instructions. Embodiments also may be implemented in data and may be stored on a non-transitory storage medium, which if used by at least one machine, causes the at least one machine to fabricate at least one integrated circuit to perform one or more operations. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
    a plurality of intellectual property (IP) logic units, each to execute instructions;
    a debug interconnect coupled to the plurality of IP logic units, the debug interconnect separate from a second interconnect that couples the plurality of IP logic units;
    a plurality of data buffers coupled to the debug interconnect, the plurality of data buffers to store hardware trace information, software trace information, and firmware trace information; and
    a bandwidth management controller coupled to the debug interconnect, the bandwidth management controller to dynamically allocate buffer space of the plurality of data buffers to the hardware trace information, the software trace information, and the firmware trace information, the bandwidth management controller further including a control logic to dynamically control at least one of a voltage and a frequency of the debug interconnect based at least in part on a debug activity level.

2. The apparatus of claim 1, further comprising a trace controller to receive trace information from the plurality of data buffers and to provide the trace information to one of a plurality of output paths.

3. The apparatus of claim 1, wherein the debug interconnect is to communicate functional information between at least some of the plurality of IP logic units during functional operation of the apparatus.

4. The apparatus of claim 3, wherein a first IP logic unit includes a control logic to enable the debug interconnect and the plurality of data buffers during the functional operation based on a functional activity level.

5. The apparatus of claim 1, further comprising a performance monitoring unit to receive performance monitoring information from at least some of the plurality of IP logic units during debug operation.

6. The apparatus of claim 5, wherein the control logic of the bandwidth management controller is to dynamically control the at least one of the voltage and the frequency further based on the performance monitoring information.

7. The apparatus of claim 1, wherein the control logic of the bandwidth management controller is to dynamically control the at least one of the voltage and the frequency responsive to a debug-level instruction received from a debug test system coupled to the apparatus.

8. The apparatus of claim 1, wherein the bandwidth management controller is to send a backpressure signal to a first input buffer associated with a first IP logic unit to reduce a bandwidth of incoming trace information from the first IP logic unit.

9. The apparatus of claim 1, wherein the bandwidth management controller is to disable the debug interconnect during functional operation of the apparatus.

10. The apparatus of claim 1, wherein the bandwidth management controller is to send a power reduction signal to a power management unit of the apparatus to enable the power management unit to reduce an activity level of one or more of the plurality of IP logic units during debug operation, wherein the bandwidth management controller is to dynamically control the debug interconnect to operate at a turbo mode level based at least in part on the reduced activity level.

11. A non-transitory machine-readable medium having stored thereon data, which if used by at least one machine, causes the at least one machine to fabricate at least one integrated circuit to perform a method comprising:
    determining an amount of hardware trace information, software trace information, and firmware trace information being received in a debug unit of the integrated circuit, based at least in part on performance monitoring information received from a plurality of logic units of the integrated circuit;
    based at least in part on determining the amount, dynamically allocating additional buffer space to a selected one of the hardware trace information, the software trace information, and the firmware trace information;
    determining a buffer level of buffer space of the debug unit allocated to the selected one trace information; and if the buffer level exceeds a first threshold, dynamically increasing at least one of a voltage and a frequency of a dedicated debug interconnect coupled between the plurality of logic units and the buffer space based thereon.

12. The non-transitory machine-readable medium of claim 11, wherein the method further comprises communicating at least some of the selected one trace information from the buffer space to a debug test system coupled to the integrated circuit.

13. The non-transitory machine-readable medium of claim 11, wherein the method further comprises dynamically increasing the at least one of the voltage and the frequency responsive to a debug-level instruction received from a debug test system coupled to the integrated circuit.

14. The non-transitory machine-readable medium of claim 11, wherein the method further comprises sending a backpressure signal to a first input buffer associated with a first logic unit to reduce a bandwidth of incoming trace information from the first logic unit.

15. The non-transitory machine-readable medium of claim 11, wherein the method further comprises enabling the integrated circuit to operate at one or more of a voltage and a frequency higher than a device specification during debug operation, under control of a debug test system coupled to the integrated circuit.

16. A system comprising:
   at least one core to independently execute instructions;
   at least one intellectual property (IP) logic to independently perform operations;
   a first interconnect coupled to the at least one core and the at least one IP logic; and
   a debug unit coupled to the at least one core and the at least one IP logic, the debug unit including:
      a debug interconnect;
      a plurality of buffers to store hardware trace information, software trace information, and firmware trace information in a debug mode and to store functional information in a functional mode; and
      a control logic to dynamically allocate the plurality of buffers to the hardware trace information, the software trace information, and the firmware trace information in the debug mode based at least in part on performance monitoring information received from the at least one core and the at least one IP logic, wherein the control logic is to dynamically control a frequency and a voltage of the debug unit in the debug mode based at least in part on a buffer level consumed by at least one of the hardware trace information, the software trace information, and the firmware trace information.

17. The system of claim 16, wherein the control logic is to dynamically increase allocation of the plurality of buffers for the hardware trace information responsive to a starvation signal received from a master of the hardware trace information.

18. The system of claim 17, wherein the control logic is to limit the dynamic increase to a configured maximum level, the configured maximum level received from a debug test system coupled to the system, the system comprising a system on chip (SoC).

19. The system of claim 18, wherein the control logic is to enable the functional information to be communicated via the debug interconnect in the functional mode of the SoC.

20. The system of claim 16, wherein the control logic is to enable the debug interconnect to operate at one or more of a voltage and a frequency higher than a device specification during the debug mode, under control of a debug test system coupled to the system.

21. The system of claim 16, further comprising a performance monitoring unit to receive performance monitoring information from the at least one core and the at least one IP logic during the debug mode, wherein the control logic is to dynamically control the at least one of the voltage and the frequency of the debug unit based at least in part on the performance monitoring information, and thereafter if the at least one core is starved, send a backpressure signal to a first input buffer associated with the at least one core to reduce a bandwidth of incoming trace information therefrom.

* * * * *